United States Patent
Holopainen et al.

(10) Patent No.: US 12,273,967 B2
(45) Date of Patent: Apr. 8, 2025

(54) DISPLAY ELEMENT AND METHOD FOR MANUFACTURING A DISPLAY ELEMENT

(71) Applicant: Lumineq Oy, Espoo (FI)

(72) Inventors: Jani Holopainen, Espoo (FI); Kari Härkönen, Espoo (FI)

(73) Assignee: Lumineq Oy, Espoo (FI)

( * ) Notice: Subject to any disclaimer, the term of this patent is extended or adjusted under 35 U.S.C. 154(b) by 123 days.

(21) Appl. No.: 17/995,826

(22) PCT Filed: Apr. 7, 2021

(86) PCT No.: PCT/FI2021/050253
§ 371 (c)(1),
(2) Date: Oct. 7, 2022

(87) PCT Pub. No.: WO2021/205073
PCT Pub. Date: Oct. 14, 2021

(65) Prior Publication Data
US 2023/0156879 A1    May 18, 2023

(30) Foreign Application Priority Data

Apr. 8, 2020 (FI) ..................... 20205372

(51) Int. Cl.
*H05B 33/14* (2006.01)
*C23C 16/30* (2006.01)
(Continued)

(52) U.S. Cl.
CPC ......... *H05B 33/145* (2013.01); *C23C 16/306* (2013.01); *H05B 33/10* (2013.01); *C23C 16/45525* (2013.01)

(58) Field of Classification Search
CPC ...... H05B 33/145; H05B 33/10; H05B 33/14; H05B 33/18; C23C 16/306;
(Continued)

(56) References Cited

U.S. PATENT DOCUMENTS

| 4,137,481 A | 1/1979 | Hilsum et al. |
| 5,009,808 A | 4/1991 | Reilly et al. |

(Continued)

FOREIGN PATENT DOCUMENTS

| CN | 1679374 | 10/2005 |
| CN | 1696244 | 11/2005 |

(Continued)

OTHER PUBLICATIONS

Converting weight percent to atomic percent (composition transformation) example problem (https://www.youtube.com/watch?v=0otCqXjZkOw) 2018—YouTube Generated Transcript. Atomic% is equal to mol% 1:07-1:13 (Year: 2018).*

(Continued)

*Primary Examiner* — Zheng Song
*Assistant Examiner* — Glenn D Zimmerman
(74) *Attorney, Agent, or Firm* — DeLizio, Peacock, Lewin & Guerra LLP

(57) ABSTRACT

This disclosure relates to use of group 4 element codoping in a phosphor layer of activator-doped zinc sulfide of a display element, a display element, and a method for manufacturing a display element. The display element (100) comprises a first insulator layer (111), a second insulator layer (112), and a first phosphor layer (121) of activator-group 4 element codoped zinc sulfide between the first insulator layer (111) and the second insulator layer (112). The first phosphor layer (121) has an average atomic percentage of group 4 elements of at least 0.01 atomic percent.

16 Claims, 2 Drawing Sheets

(51) Int. Cl.
*H05B 33/10* (2006.01)
*C23C 16/455* (2006.01)

(58) Field of Classification Search
CPC ............ C23C 16/45525; C09K 11/565; C09K 11/574; C09K 11/672; C09K 11/7745; C09K 11/7703; C09K 11/773; H01J 11/42
See application file for complete search history.

(56) References Cited

U.S. PATENT DOCUMENTS

| | | | |
|---|---|---|---|
| 5,273,774 A | 12/1993 | Karam et al. | |
| 5,309,070 A * | 5/1994 | Sun .................. | H05B 33/22 313/503 |
| 5,496,597 A * | 3/1996 | Soininen .............. | H05B 33/22 427/126.3 |
| 5,751,108 A | 5/1998 | Kanemura et al. | |
| 6,451,460 B1 * | 9/2002 | Sun .................... | H05B 33/145 428/917 |
| 11,464,087 B2 * | 10/2022 | Seppänen ............. | C23C 14/542 |
| 2004/0161631 A1 * | 8/2004 | Liu ...................... | H05B 33/22 428/917 |
| 2005/0248276 A1 | 11/2005 | Nomura et al. | |
| 2005/0269933 A1 * | 12/2005 | Nagasaki ............. | C09K 11/685 313/582 |
| 2007/0210708 A1 | 9/2007 | Ono et al. | |
| 2015/0189718 A1 * | 7/2015 | Harkonen ............. | H05B 33/10 313/503 |
| 2019/0223268 A1 | 7/2019 | Seppanen et al. | |

FOREIGN PATENT DOCUMENTS

| | | | |
|---|---|---|---|
| CN | 104396346 | 3/2015 | |
| CN | 204968145 | 1/2016 | |
| CN | 108337918 | 7/2018 | |
| CN | 109716865 | 5/2019 | |
| EP | 1471774 | 10/2004 | |
| JP | H05135875 | 6/1993 | |
| WO | WO-2004052238 A2 * | 6/2004 | ............ A61F 15/00 |
| WO | 2018220160 | 12/2018 | |
| WO | 2021205073 | 10/2021 | |

OTHER PUBLICATIONS

"Office Action issued in related Chinese Patent Application No. 202180027522.9", Jun. 30, 2023, 11 pages.

"Search Report issued for CN Application 202180027522.9", Jun. 30, 2023, 3 pages.

"FI Application No. 20205372 Search Report", Nov. 6, 2020, 2 pages.

"PCT Application No. PCT/FI2021/050253 International Search Report", Oct. 14, 2021, 6 pages.

Leskelä, et al., "Review Article: Atomic layer deposition of optoelectronic materials", Apr. 5, 2019, 24 pages.

"Extended European Search Report for EP21784669.0", May 2, 2024, 5 pages.

* cited by examiner

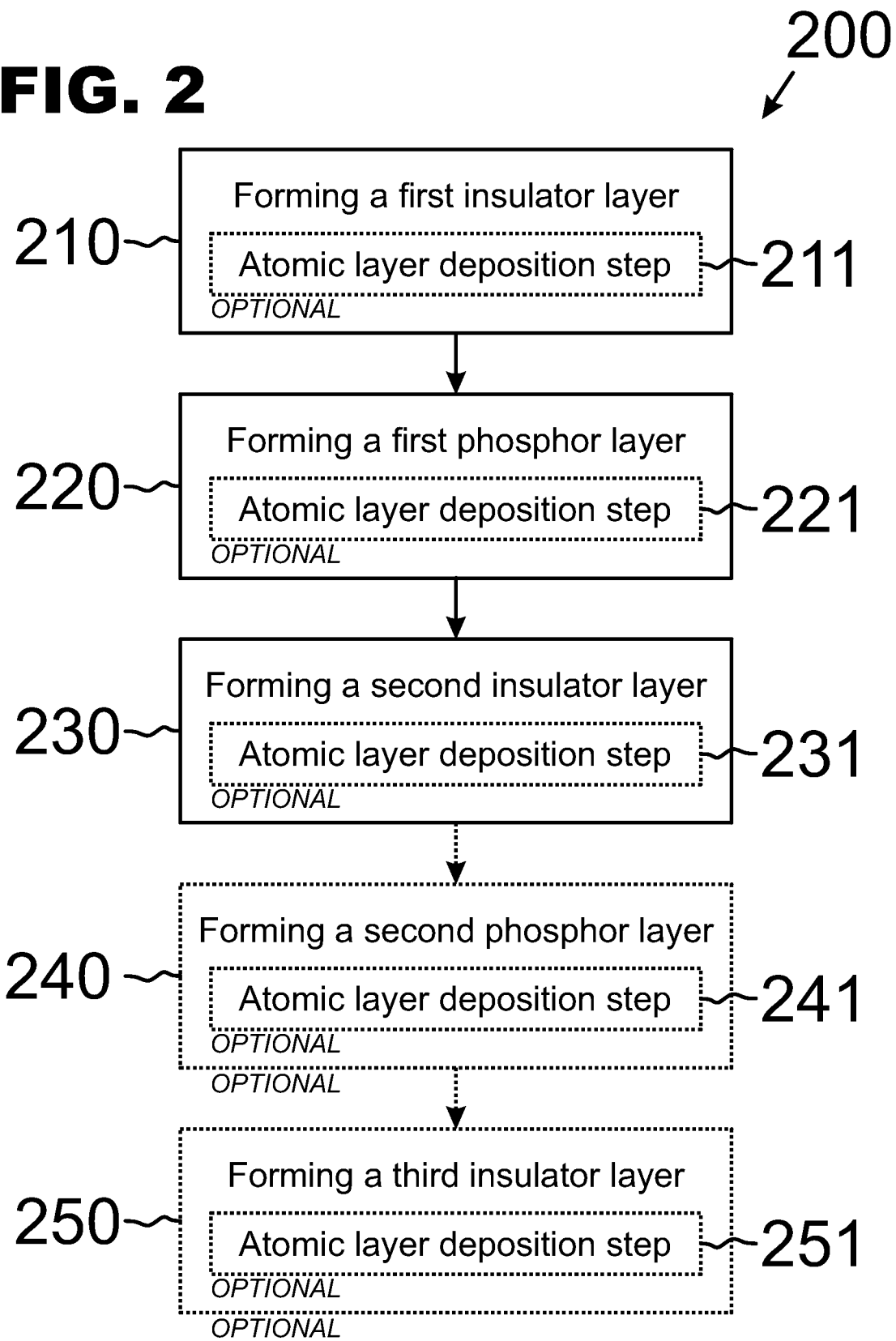

DISPLAY ELEMENT AND METHOD FOR MANUFACTURING A DISPLAY ELEMENT

FIELD OF TECHNOLOGY

This disclosure relates to display elements. In particular, this disclosure concerns zinc sulfide-based materials for phosphor layers of display elements.

BACKGROUND

Phosphor materials that exhibit luminescence are commonly used in display elements, such as inorganic thin film electroluminescent (TFEL) display elements. Many conventional display elements are provided with inorganic phosphor materials, wherein trace amounts of one or more dopants are added to a host material, such as zinc sulfide (ZnS). Such doping may be used to provide the host material with luminescence centers. Generally, dopants whose addition into a host material results in the formation of such luminescence centers may be referred to as activators. In conventional ZnS-based inorganic phosphor materials, many different types of activators are used. Examples of such activators include europium (Eu), manganese (Mn), samarium (Sm), and terbium (Tb).

Although display elements utilizing conventional ZnS-based phosphor materials are known especially for their high aging stability, such materials still tend to gradually lose some of their brightness. In light of this, it may be desirable to develop new solutions related to ZnS-based phosphor materials, for example, in order to further increase the aging stability and/or brightness of display elements utilizing such phosphor materials.

SUMMARY

This summary is provided to introduce a selection of concepts in a simplified form that are further described below in the detailed description. This summary is not intended to identify key features or essential features of the claimed subject matter, nor is it intended to be used to limit the scope of the claimed subject matter.

According to a first aspect, a display element is provided. The display element comprises a first insulator layer, a second insulator layer, and a first phosphor layer of activator-group 4 element codoped zinc sulfide (ZnS:X,Y) between the first insulator layer and the second insulator layer. The first phosphor layer has an average atomic percentage of group 4 elements (at-$\%_Y^{ave}$) of at least 0.01 atomic percent (at-$\%_Y^{ave}$).

According to a second aspect, this disclosure relates to use of group 4 element (Y) codoping in a phosphor layer of activator-doped zinc sulfide (ZnS:X) of a display element.

In an embodiment of the second aspect, group 4 element (Y) codoping is used in a phosphor layer of activator-doped zinc sulfide (ZnS:X) of a display element for increasing aging stability and/or brightness of the display element.

In an embodiment of the second aspect, which may be in accordance with the previous embodiment, the display element is a display element in accordance with the first aspect.

According to a third aspect, a method for manufacturing a display element is provided. The method comprises forming a first insulator layer, forming a first phosphor layer of activator-group 4 element codoped zinc sulfide (ZnS:X,Y), and forming a second insulator layer such that the first phosphor layer is arranged between the first insulator layer and the second insulator layer. The first phosphor layer has an average atomic percentage of group 4 elements (at-$\%_Y^{ave}$) of at least 0.01 atomic percent, at-%.

It is specifically to be understood that a method according to the third aspect may be used to provide any display element according to the first aspect disclosed within this specification. Correspondingly, any method according to the third aspect disclosed within this specification may be used to provide a display element according to the first aspect.

BRIEF DESCRIPTION OF THE DRAWINGS

The present disclosure will be better understood from the following detailed description read in light of the accompanying drawings, wherein:

FIG. 2 illustrates a method for manufacturing a display element.

Figure 1:
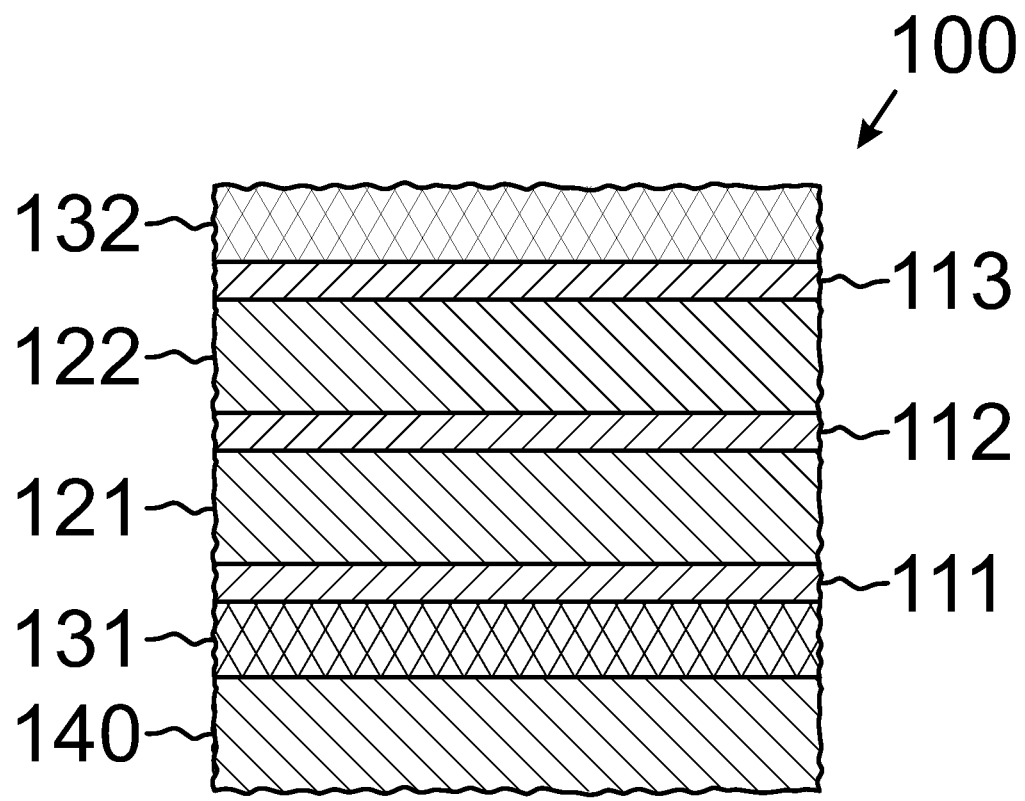
FIG. 1 shows a partial cross-sectional view of a display element.

Unless specifically stated to the contrary, any drawing of the aforementioned drawings may be not drawn to scale such that any element in said drawing may be drawn with inaccurate proportions with respect to other elements in said drawing in order to emphasize certain structural aspects of the embodiment of said drawing.

DETAILED DESCRIPTION

FIG. 1 depicts a display element 100 according to an embodiment.

Throughout this specification, a "display element" may refer to an element comprising at least one emissive area for emitting light therefrom in order to present visual information.

In the embodiment of FIG. 1, the display element 100 comprises a first insulator layer 111 and a second insulator layer 112.

In this disclosure, a "layer" may refer to a generally sheet-formed element arranged on a surface or a body. Additionally or alternatively, a layer may refer to one of a series of superimposed, overlaid, or stacked generally sheet-formed elements. A layer may be path-connected. Some layers may be locally path-connected and disconnected.

Although a layer may generally comprise a plurality of sublayers of different materials or material compositions, an "insulator layer" may refer to a layer formed of electrical insulator material(s). Additionally or alternatively, an insulator layer may refer to layer exhibiting an average electrical resistivity of at least $10^5$ ohm-meters ($\Omega$m), or at least $10^6$ $\Omega$m, or at least $10^7$ $\Omega$m, or at least $10^8$ $\Omega$m at standard temperature and pressure conditions, for example.

Generally, a layer being "formed of" a material or materials may refer to said layer comprising, or comprising substantially, or consisting essentially of, or consisting of said material or materials.

In the embodiment of FIG. 1, the display element 100 further comprises a first phosphor layer 121 of activator-group 4 element codoped zinc sulfide (ZnS:X,Y). The first phosphor layer 121 is arranged between the first insulator layer 111 and the second insulator layer 112.

Throughout this specification, a "phosphor layer" may refer to a layer formed of phosphor material(s). Additionally or alternatively, a phosphor layer may refer to a layer exhibiting luminescence, e.g., phosphorescence or electroluminescence. In particular, a "phosphor layer of ZnS:X,Y" may refer to a layer formed of zinc sulfide (ZnS), wherein the colon notation designates the usage of at least two elements for doping the ZnS, first of the at least two elements being an activator (X) and second of the at least two elements being a group 4 element (Y). Generally, one or more group 4 elements and one or more activators may be used as dopants in a phosphor layer of ZnS:X,Y. As is apparent to the skilled person, a phosphor layer of ZnS:X,Y may generally comprise any impurities other than group 4 elements and activators, for example, one or more of carbon (C), nitrogen (N), oxygen (O), and chlorine (Cl).

Herein, an "activator" may refer to a chemical element the addition of which to a host material as a dopant results in the formation of luminescence centers within the host material. For example, when ZnS is used as a host material, suitable activators include europium (Eu), manganese (Mn), samarium (Sm), and terbium (Tb).

Further, a "group 4 element", or "Y", may refer to a chemical element belonging to group 4 of the periodic table of elements, i.e., titanium (Ti), zirconium (Zr), hafnium (Hf), or rutherfordium (Rf). As known to the skilled person, titanium (Ti), zirconium (Zr), and hafnium (Hf) are mostly used in practical applications, since Rf is a synthetic chemical element not found in nature.

The first phosphor layer 121 of the embodiment of FIG. 1 may have an average atomic percentage of group 4 elements (at-$\%_Y^{ave}$) of at least 0.01 atomic percent (at-%). Generally, use of group 4 element (Y) codoping in a phosphor layer of activator-doped zinc sulfide (ZnS:X) of a display element may enable increasing aging stability and/or (initial) brightness of the display element, and an at-$\%_Y^{ave}$ of at least 0.01 at-% may emphasize such increase(s) in aging stability and/or (initial) brightness.

Herein, an "average atomic percentage of group 4 elements", or "at-$\%_Y^{ave}$", of a phosphor layer may refer to a measure of a ratio, expressed as a percentage, of a total number of group 4 element atoms in said phosphor layer to total number of atoms in said phosphor layer. In practice, at-$\%_Y^{ave}$ may be experimentally determinable, for example, based on time-of-flight elastic recoil detection analysis (ToF-ERDA) and/or scanning transmission electron microscopy (STEM) coupled with energy-dispersive X-ray spectroscopy (EDX). As known to the skilled person, in some cases, determination of at-$\%_Y^{ave}$ of a representative sample of a phosphor layer may be sufficient for adequately determining at-$\%_Y^{ave}$ of said phosphor layer. Said representative sample may, for example, correspond to a part of said phosphor layer or at least part, i.e., part or the entirety, of a layer formed by a process closely resembling a process used to form said phosphor layer.

The first phosphor layer 121 of the embodiment of FIG. 1 may have an at-$\%_Y^{ave}$ of approximately 0.1 at-%, for example. In other embodiments, a first phosphor layer may have any experimentally verifiable at-$\%_Y^{ave}$, for example, an at-$\%_Y^{ave}$ of at least 0.01 at-%, or at least 0.02 at-%, or at least 0.03 at-%, or at least 0.04 at-%, or at least 0.05 at-% and/or at most 0.15 at-%, or at most 0.3 at-%, or at most 0.5 at-%, or at most 1 at-%, or at most 2 at-%. Generally, at lower doping concentrations, increase in at-$\%_Ti^{ave}$ may result in an increase in aging stability and/or (initial) brightness of a display element. On the other hand, at higher doping concentrations, an increase in at-$\%_Ti^{ave}$ may result in a decrease in brightness of a display element. Additionally or alternatively, increase in at-$\%_Ti^{ave}$ may steepen a voltage-luminance curve of a display element, especially at higher voltages.

In the embodiment of FIG. 1, Mn may be used as an activator (X) in the first phosphor layer 121. In other embodiments, any suitable activator(s), for example, at least one of Eu, Mn, Sm, and Tb may be used as activator(s) in a first phosphor layer.

In the embodiment of FIG. 1, Ti may be used as a group 4 element dopant (Y) in the first phosphor layer 121. In other embodiments, any suitable group 4 element dopant(s), for example, at least one of Ti, Zr, Hf, and Rf, may be used as group 4 element dopant(s) in a first phosphor layer.

The first phosphor layer 121 of the embodiment of FIG. 1 may have an average atomic percentage of activators (at-$\%_X^{ave}$) of approximately 0.5 at-%. In other embodiments, a first phosphor layer may have any suitable at-$\%_X^{ave}$, for example, an at-$\%_X^{ave}$ of at least 0.05 at-% or at least 0.1 at-% and/or at most 1.5 at-% or at most 3 at-%. In other embodiments, wherein a first phosphor layer is doped with at least two activators, said first phosphor layer may have a contribution to its at-$\%_X^{ave}$ from each of said at least two activators.

Herein, an "average atomic percentage of activators", or "at-$\%_X^{ave}$", of a phosphor layer may refer to a measure of a ratio, expressed as a percentage, of a total number of activator atoms in said phosphor layer to total number of atoms in said phosphor layer. In practice, at-$\%_X^{ave}$ may be experimentally determinable similarly to at-$\%_Y^{ave}$.

In the embodiment of FIG. 1, the first phosphor layer (121) may have an atomic ratio of group 4 elements to activators ($R_{Y:X}^{ave}$) of approximately 0.2. Generally, a lower $R_{Y:X}^{ave}$ may reduce interactions between activator dopant atoms and dopant atoms of group 4 element(s), which may, in turn, facilitate limiting non-radiative relaxation of luminescence centers in a host material. In other embodiments, a first phosphor layer may have any suitable value of $R_{Y:X}^{ave}$, for example, a $R_{Y:X}^{ave}$ of higher than 1, or at most 1, or at most 0.8, or at most 0.6, or at most 0.4.

Herein, an "atomic ratio of group 4 elements to activators", or "$R_{Y:X}^{ave}$", of a phosphor layer may refer to a ratio between an average atomic percentage of group 4 elements (at-$\%_Y^{ave}$) and an average atomic percentage of activators (at-$\%_X^{ave}$) of said phosphor layer.

In some embodiments, a phosphor layer of ZnS:X,Y may have an average atomic percentage of zinc (Zn) of at least 40 at-%, or at least 42 at-%, or at least 44 at-%, or at least 46 at-%, or at least 48 at-% and/or an average atomic percentage of sulfur (S) of at least 40 at-%, or at least 42 at-%, or at least 44 at-%, or at least 46 at-%, or at least 48 at-% and/or an atomic ratio of Zn to S in a range from 0.6 to 1.4, or from 0.7 to 1.3, or from 0.8 to 1.2, or from 0.9 to 1.1.

The first insulator layer 111 and the second insulator layer 112 of the embodiment of FIG. 1 may be formed of a mixed oxide of aluminum (Al) and a group 4 element (Y), which may be titanium (Ti). Generally, a first insulator layer and/or a second insulator layer comprising a compound of a group 4 element (Y) used in a phosphor layer may reduce a probability of inadvertently contaminating equipment used for forming said phosphor layer as well as said first insulator layer and/or said second insulator layer, when said phosphor layer having an at-$\%_Y^{ave}$ of at least 0.01 at-% is formed. Additionally or alternatively, a first insulator layer and/or a second insulator layer comprising a compound of Y may reduce a probability of properties of said first insulator layer and/or said second insulator layer being altered over time due to atomic diffusion of Y. In other embodiments, a first insulator layer and/or a second insulator layer may be formed of any suitable material (s), for example, one or more of aluminum oxide ($Al_2O_3$), tantalum pentoxide ($Ta_2O_5$), one or more group 4 element dioxides ($YO_2$), and mixtures and laminates, e.g., nano-laminates, thereof. In said other embodiments, a first insulator layer and/or a second insulator layer may or may not comprise a compound of Y used as a dopant in a first phosphor layer, e.g., group 4 element dioxide ($YO_2$); complex oxide of said group 4 element, such as strontium titanate ($SrTiO_3$); or mixed oxide comprising Y, such as a mixture of titanium oxide $TiO_2$ and aluminum oxide $Al_2O_3$.

The display element 100 of the embodiment of FIG. 1 may comprise a third insulator layer 113 and a second phosphor layer 122 between the second insulator layer 112 and the third insulator layer 113. Generally, provision of such third insulator layer and such second phosphor layer may facilitate increasing transparency and/or reducing haziness of a display element. However, such modification(s) in optical properties may be accompanied by a reduction in aging stability, which may be at least partly remedied by usage of Y codoping in at least one phosphor layer of ZnS:X of said display element. In other embodiments, a display element may or may not comprise a third insulator layer and a second phosphor layer between a second insulator layer and said third insulator layer.

The third insulator layer 113 of the embodiment of FIG. 1 may be arranged between the second phosphor layer 122 and the second conductor layer 132. In other embodiments, wherein a display element comprises a third insulator layer and a second phosphor layer between a second insulator layer and said third insulator layer, said third insulator layer may or may not be arranged between said second phosphor layer and a second conductor layer.

The first insulator layer 111 of the embodiment of FIG. 1 may have a thickness of approximately 200 nanometers (nm). In other embodiments, a first insulator layer may have any suitable thickness, for example, a thickness of at least 10 nm, or at least 50 nm, or at least 100 nm, or at least 150 nm, or at least 200 nm and/or at most 500 nm, or at most 400 nm, or at most 300 nm.

The second insulator layer 112 of the embodiment of FIG. 1 may have a thickness of approximately 90 nanometers (nm). In other embodiments, wherein a display element comprises a third insulator layer and a second phosphor layer between a second insulator layer and said third insulator layer, said second insulator layer may have any suitable thickness, for example, a thickness of at least 10 nm, or at least 50 nm, or at least 75 nm and/or at most 300 nm, or at most 150 nm, or at most 100 nm. In other embodiments, wherein a display element does not comprise such third insulator layer nor such second phosphor layer, a second insulator layer may have any suitable thickness, for example, a thickness of at least 10 nm, or at least 50 nm, or at least 100 nm, or at least 150 nm, or at least 200 nm and/or at most 500 nm, or at most 400 nm, or at most 300 nm.

The third insulator layer 113 of the embodiment of FIG. 1 may have a thickness of approximately 200 nanometers (nm). In other embodiments, a third insulator layer may have any suitable thickness, for example, a thickness of at least 10 nm, or at least 50 nm, or at least 100 nm, or at least 150 nm, or at least 200 nm and/or at most 500 nm, or at most 400 nm, or at most 300 nm.

The first phosphor layer 121 of the embodiment of FIG. 1 may have a thickness of approximately 270 nm. In other embodiments, wherein a display element comprises a third insulator layer and a second phosphor layer between a second insulator layer and said third insulator layer, a first phosphor layer may have any suitable thickness, for example, a thickness of at least 50 nm, or at least 80 nm, or at least 100 nm, or at least 150 nm, or at least 200 nm and/or at most 600 nm, or at most 400 nm, or at most 350 nm. In other embodiments, wherein a display element does not comprise such third insulator layer nor such second phosphor layer, a first phosphor layer may have any suitable thickness, for example, a thickness of at least 50 nm, or at least 100 nm, or at least 150 nm, or at least 200 nm and/or at most 1100 nm, or at most 1000 nm, or at most 900 nm.

The second phosphor layer 122 of the embodiment of FIG. 1 may have a thickness of approximately 270 nanometers (nm). In other embodiments, a second phosphor layer may have any suitable thickness, for example, a thickness of at least 50 nm, or at least 80 nm, or at least 100 nm, or at least 150 nm, or at least 200 nm and/or at most 600 nm, or at most 400 nm, or at most 350 nm.

Although two phosphor layers are depicted in FIG. 1, a display element may generally comprise any suitable number of, e.g., one or more, two or more, three or more, etc., phosphor layers. In embodiments, wherein a display element comprises a plurality of phosphor layers, each phosphor layer of the plurality of phosphor layers may be arranged between insulator layers. In some of such embodiments, phosphor layers of the plurality of phosphor layers and insulator layers may be arranged alternately on one another.

The display element 100 of the embodiment is implemented specifically as an inorganic thin film electroluminescent (TFEL) display element. In other embodiments, display element may be implemented as any suitable type of display element, for example, as an inorganic TFEL display element.

Throughout this specification, a "thin film" display element may refer to a display element having a total thickness less than or equal to 50 micrometers (μm), or less than or equal to 20 μm, or less than or equal to 10 μm. Individual layers of a thin film display element may have thicknesses, for example, in a range from a few nanometers to some hundreds of nanometers or some micrometers.

Further, an "inorganic thin film electroluminescent" display element may refer to a thin film display element comprising an inorganic phosphor layer. Additionally or alternatively, an inorganic thin film electroluminescent display element may refer to a thin film display element, wherein a first insulator layer may be arranged between an inorganic first phosphor layer and a first conductor layer and a second insulator layer may be arranged between said first phosphor layer and a second conductor layer. In inorganic TFEL displays, an alternating or pulsed driving voltage may be applied over a first insulator layer, an inorganic phosphor layer, and a second conductor layer, for example, between at least part of a first conductor layer and at least part of a second conductor layer. An inorganic TFEL display driven with pulsed or alternating voltages may be referred to as an inorganic "AC TFEL display". Peak-to-peak amplitudes of such driving voltages may be, for example, few hundreds of volts, generated by a specific display driver unit and fed to display electrodes via conductors from display terminals of said display driver unit.

In the embodiment of FIG. 1, the display element 100 comprises a first conductor layer 131 and a second conductor layer 132. The first insulator layer 111 is arranged between the first conductor layer 131 and the first phosphor layer 121, and the second insulator layer 112 is arranged between the second conductor layer 132 and the first phosphor layer 121. In other embodiments, a display element 100 may or may not comprise such first conductor layer and/or a second conductor layer.

Throughout this specification, a "conductor" may refer to an electrical conductor material and/or the electrical conductivity thereof. Consequently, a "conductor layer" may refer to a layer comprising a conductor material. Additionally or alternatively, a conductor layer may be electrically non-insulating, e.g., electrically conductive.

In the embodiment of FIG. 1, the second phosphor layer 122 and the third insulator layer 113 are arranged between the second insulator layer 112 and the second conductor layer 132. In other embodiments, wherein a display element comprises a third insulator layer and a second phosphor layer between a second insulator layer and the third insulator layer, said second phosphor layer and said third insulator layer may or may not be arranged between said second insulator layer and said second conductor layer.

In the embodiment of FIG. 1, the display element 100 further comprises a substrate 140. In other embodiments, a display element may comprise a substrate. Generally, a display element may be formed on any appropriate substrate.

In this specification, a "substrate" may refer to a solid body providing a surface such that material may be arranged, deposited, etched, and/or inscribed on the surface. A substrate may be formed, for example, of glass, e.g., sodalime, aluminosilicate, and/or any other appropriate transparent glass, or plastic. Suitable plastic materials include, for example, polyethylene (PE), polycarbonate (PC), and mixtures thereof, without being limited to these examples. A substrate may mechanically protect a display element and/or serve as an electrically insulating layer between said display element and surroundings thereof.

Although not illustrated in FIG. 1, a display element may also comprise a protective and/or insulating layer on its side opposite to a side of its substrate. Such another layer may be formed by an external layer or element to which a display element is attached.

Above, mainly structural and material aspects of display elements are discussed. In the following, more emphasis will lie on aspects related to methods for manufacturing display elements. What is said above about the ways of implementation, definitions, details, and advantages related to the structural and material aspects apply, mutatis mutandis, to the method aspects discussed below. The same applies vice versa.

FIG. 2 illustrates a method 200 for manufacturing a display element. In other embodiments, a method for manufacturing a display element may be identical, similar, or different to the method 200 of the embodiment of FIG. 2.

In the embodiment of FIG. 2, the method 200 comprises forming a first insulator layer 210, forming a first phosphor layer 220 of activator-group 4 element codoped zinc sulfide (ZnS:X,Y), and forming a second insulator layer 230 such that the first phosphor layer 121 is arranged between the first insulator layer 111 and the second insulator layer 112. The first phosphor layer has an at-$\%_Y^{ave}$ of at least 0.01 at-%.

As indicated in FIG. 2 using dotted lines, the method 200 of the embodiment of FIG. 2 may optionally further comprise forming a second phosphor layer 240 such that the second insulator layer is arranged between the first phosphor layer and the second phosphor layer, and forming a third insulator layer 250 such that the second phosphor layer is arranged between the second insulator layer and the third insulator layer. In other embodiments, a method for manufacturing a display element may or may not comprise forming a second phosphor layer such that a second insulator layer is arranged between a first phosphor layer and said second phosphor layer and forming a third insulator layer such that said second phosphor layer is arranged between said second insulator layer and said third insulator layer.

In the embodiment of FIG. 2, each of the process of forming a first insulator layer 210, the process of forming a first phosphor layer 220, the process of forming a second insulator layer 230, the process of forming a second phosphor layer 240, and the process of forming a third insulator layer 250 may comprise an atomic layer deposition step 211, 221, 231, 241, 251 as indicated in FIG. 2 using dotted lines. Generally, one or more of a process of forming a first insulator layer, a process of forming a first phosphor layer, a process of forming a second insulator layer, a process of forming a second phosphor layer, and a process of forming a third insulator layer comprising an atomic layer deposition step may facilitate forming one or more layers of a display element with greater control over the layer thickness(es) and/or layer composition(s) of said one or more layers. In other embodiments, one or more of a process of forming a first insulator layer, a process of forming a first phosphor layer, a process of forming a second insulator layer, a process of forming a second phosphor layer, and a process of forming a third insulator layer may or may not comprise an atomic layer deposition step. Generally, any of a process of forming a first insulator layer, a process of forming a first phosphor layer, a process of forming a second insulator layer, a process of forming a second phosphor layer, and a process of forming a third insulator layer may comprise any suitable sub-process(es) and/or step(s). For example, in some embodiments, one or more of a process of forming a first insulator layer, a process of forming a first phosphor layer, a process of forming a second insulator layer, a process of forming a second phosphor layer, and a process of forming a third insulator layer may comprise a hydrothermal deposition step and/or a sol-gel deposition step in addition to or as an alternative to an atomic layer deposition step. In some embodiments, chemical vapor deposition methods other than atomic layer deposition may be used.

In this specification, a "process" may refer to a series of one or more steps, leading to an end result. As such, a process may be a single-step or a multi-step process. Additionally, a process may be divisible to a plurality of sub-processes, wherein individual sub-processes of such plurality of sub-processes may or may not share common steps.

Herein, a "step" may refer to a measure taken in order to achieve a pre-defined result. For example, an "atomic layer deposition step" may refer to a step of a process, whereby a layer is formed by atomic layer deposition.

Further, "atomic layer deposition", or "ALD", or "atomic layer epitaxy", may refer to a thin film deposition technology enabling accurate and well-controlled production of thin film coatings with nanoscale thicknesses. During an atomic layer deposition step, a substrate may be alternately exposed to at least two precursors, commonly one precursor at a time, to form a coating layer on the substrate by alternately repeating essentially self-limiting surface reactions between the surface of either the substrate or, at later stages of the atomic layer deposition step, the surface of the already formed coating layer and the precursors. As a result, the deposited material is grown on the substrate molecule layer by molecule layer.

In the embodiment of FIG. 2, zinc chloride ($ZnCl_2$), manganese chloride ($MnCl_2$), titanium tetrachloride ($TiCl_4$), and hydrogen sulfide ($H_2S$) are used as precursors in the atomic layer deposition steps 221, 241 of the processes of forming a first phosphor layer 220 and forming a second phosphor layer 240. Additionally, $TiCl_4$, aluminum trichloride ($AlCl_3$) and water ($H_2O$) are used as precursors in the atomic layer deposition steps 211, 231, 251 of the processes of forming a first insulator layer 210, forming a second insulator layer 230, and forming a third insulator layer 250. In other embodiments, any suitable precursors may be used. For example, in some embodiments, one or more group 4 element tetrachlorides ($YCl_4$), e.g., $TiCl_4$, hafnium chloride ($HfCl_4$), and zirconium chloride ($ZrCl_4$), and/or tantalum pentachloride ($TaCl_5$) may be used.

In the embodiment of FIG. 2, $TiCl_4$ is used as a titanium (Ti) precursor in the atomic layer deposition steps 211, 221, 231 of the processes of forming a first insulator layer 210, forming a first phosphor layer 220, and forming a second insulator layer 230. Generally, a process of forming a first insulator layer and/or a process of forming a second insulator layer comprising an atomic layer deposition step, wherein a group 4 element (Y) precursor, e.g., any group 4 element tetrachloride ($YCl_4$), used in an atomic layer deposition step of a process of forming a first phosphor layer is used as a precursor, may reduce a probability of inadvertently contaminating ALD equipment used for forming a first phosphor layer as well as said first insulator layer and/or said second insulator layer, when a Y-codoped first phosphor layer is formed. In other embodiments, a process of forming a first insulator layer and/or a process of forming a second insulator layer may or may not comprise an atomic layer deposition step, wherein a Y precursor used in an atomic layer deposition step of a process of forming a first phosphor layer is used as a precursor.

In the embodiment of FIG. 2, atomic layer deposition steps 211, 221, 231, 241, 251 of the processes of forming a first insulator layer 210, forming a first phosphor layer 220, forming a second insulator layer 230, forming a second phosphor layer 240, and forming a third insulator layer 250 are implemented as thermal atomic layer deposition steps. In other embodiments, any suitable type(s) of atomic layer deposition steps, for example, thermal atomic layer deposition step(s), and/or plasma-assisted atomic layer deposition step(s), and/or photo-assisted atomic layer deposition step(s), may be used.

In the embodiment of FIG. 2, processing temperatures of at least 400 degrees Celsius (° C.), for example, approximately 450° C., are used in the atomic layer deposition steps 221, 241 of the processes of forming a first phosphor layer 220 and forming a second phosphor layer 240 due to the usage of $ZnCl_2$ and $MnCl_2$ as precursors. In other embodiments, precursors other than $ZnCl_2$ and $MnCl_2$, e.g., diethylzinc (DEZ) and/or tris(2,2,6,6-tetramethyl-3,5-heptanedione)M (i.e., $M(thd)_3$), (M=Mn, Tb, Sm, Eu), may be used as an alternative to $ZnCl_2$ and $MnCl_2$. In said other embodiments, any suitable processing temperatures, for example, processing temperatures below 400° C., or below 350° C., or below 270° C. may be used.

In an embodiment, a method for manufacturing a display element comprises processes and steps corresponding to the processes 210, 220, 230, 240, 250 and steps 211, 221, 231, 241, 251 of the method 200 of the embodiment of FIG. 2. In an embodiment, a method for manufacturing a display element comprises processes corresponding to the processes 210, 220, 230, 240, 250 in the absence of step(s) corresponding to one or more of steps 211, 221, 231, 241, 251 of the method 200 of the embodiment of FIG. 2. In some embodiments, a method for manufacturing a display element may comprise processes corresponding to the processes 210, 220, 230 of the method 200 of the embodiment of FIG. 2. Generally, steps of a method for manufacturing a display element implementing processes corresponding to any of the processes 210, 220, 230 of the method 200 of the embodiment of FIG. 2 need not be executed in a fixed order. Additionally, a method for manufacturing a display element may comprise any number of additional processes and/or steps that are not disclosed herein in connection to the method 200 of the embodiment of FIG. 2.

In the following, a number of examples are detailed.

In a first example, a method for manufacturing a display element in accordance with the method 200 of the embodiment of FIG. 2 was used to manufacture an exemplary display element in accordance with the display element 100 of the embodiment of FIG. 1. The first insulator layer, the first phosphor layer, the second insulator layer, the second phosphor layer, and the third insulator layer of the exemplary display element were manufactured in a batch-type P400 ALD reactor. Additionally, a reference display element differing from the exemplary display element solely in the lack of Ti codoping in its first phosphor layer was manufactured.

Each of the exemplary display element and the reference display element were subjected to an aging test, wherein the display elements were driven by a sinusoidal driving voltage with a root-mean-square voltage of approximately 135 volts (V) at a frequency of approximately 540 Hertz (Hz) for a total of 115 hours (h). Luminance values were measured for both display elements before the aging test and once every 23 h during the test.

Initially, the reference display element had a luminance value approximately 1.7% higher than the luminance value of the exemplary display element. Nevertheless, already after 23 h of aging, the exemplary display element showed a luminance value approximately 9.0% higher than that of the reference display element. Furthermore, after 115 h of aging, the luminance value of the exemplary display element was already approximately 17.8% higher than that of the reference display element.

In a second example, an exemplary phosphor layer of activator-group 4 element codoped zinc sulfide (ZnS:X,Y; X=Mn, Y=Ti) corresponding to the first phosphor layer of the exemplary display element of the first example was formed onto a semiconductor wafer coated with a layer of aluminum oxide ($Al_2O_3$).

ToF-ERDA analysis of the exemplary phosphor layer was performed with 40 megaelectronvolt (MeV) $^{79}Br^{+7}$ and $^{127}I^{+7}$ ion beams. The results of the ToF-ERDA analysis showed that the concentration of Ti in the exemplary phosphor layer was between 0.035 at-% and 0.15 at-% and that the concentration of Mn in the exemplary phosphor layer was between 0.53 at-% and 0.57 at-%. Consequently, the exemplary phosphor layer had an atomic ratio of group 4 elements to activators ($R_{Y:X}^{ave}$) of at most approximately 0.283 at-%.

It is obvious to a person skilled in the art that with the advancement of technology, the basic idea of the invention may be implemented in various ways. The invention and its embodiments are thus not limited to the examples described above, instead they may vary within the scope of the claims.

It is to be understood that any embodiments of the first, second, and third aspects described above may be used in combination with each other. Several of the embodiments may be combined together to form a further embodiment.

It will be understood that any benefits and advantages described above may relate to one embodiment or may relate to several embodiments. The embodiments are not limited to those that solve any or all of the stated problems or those that have any or all of the stated benefits and advantages.

The term "comprising" is used in this specification to mean including the feature(s) or act(s) followed there-after, without excluding the presence of one or more additional features or acts. It will further be understood that reference to 'an' item refers to one or more of those items.

SYMBOLS

X activator element
Al aluminum
$AlCl_3$ aluminum trichloride
$Al_2O_3$ aluminum oxide
C carbon
Cl chlorine
Eu europium
H hydrogen
$H_2S$ hydrogen sulfide
Mn manganese
$MnCl_2$ manganese chloride
N nitrogen
oxygen
Sm samarium
Sr strontium
$SrTiO_3$ strontium titanate
S sulfur
Ta tantalum
Tb terbium
Y group 4 element, i.e., titanium group element (titanium (Ti), zirconium (Zr), hafnium, Hf; or rutherfordium, Rf)
$YCl_4$ group 4 element tetrachloride
$YO_2$ group 4 element dioxide
$H_2O$ water
Zn zinc
$ZnCl_2$ zinc chloride
ZnS zinc sulfide
ZnS:X activator-doped zinc sulfide
ZnS:Mn manganese-doped zinc sulfide
ZnS:X,Y activator-group 4 element codoped zinc sulfide
at-% atomic percentage
at-$\%_X^{ave}$ average atomic percentage of activators
at-$\%_Y^{ave}$ average atomic percentage of group 4 elements
$R_{Y:X}^{ave} = $at-$\%_Y^{ave}/$at-$\%_X^{ave}$
atomic ratio of group 4 elements to activators

REFERENCE SIGNS 100 display element
111 first insulator layer
112 second insulator layer
113 third insulator layer
121 first phosphor layer
122 second phosphor layer
131 first conductor layer
132 second conductor layer
140 substrate
200 method
210 forming a first insulator layer
211 atomic layer deposition step
220 forming a first phosphor layer
221 atomic layer deposition step
230 forming a second insulator layer
231 atomic layer deposition step
240 forming a second phosphor layer
241 atomic layer deposition step
250 forming a third insulator layer
251 atomic layer deposition step

The invention claimed is:

1. A display element comprising:
a first insulator layer;
a second insulator layer; and
a first phosphor layer of activator-group 4 element codoped zinc sulfide, ZnS:X,Y, between the first insulator layer and the second insulator layer;
wherein the first phosphor layer has an average atomic percentage of group 4 elements, at-$\%_{ave}^Y$, of at least 0.01 atomic percent, at-%;
wherein at least one of europium, Eu; manganese, Mn; samarium, Sm; and terbium, Tb, is used as an activator, X, in the first phosphor layer; and
wherein at least one of titanium, Ti; zirconium, Zr; hafnium, Hf; and rutherfordium, Rf, is used as a group 4 element dopant, Y, in the first phosphor layer.

2. The display element according to claim 1, wherein the first phosphor layer has an average atomic percentage of group 4 elements, at-$\%_Y^{ave}$, of at least 0.01 at-%, or at least 0.02 at-%, or at least 0.03 at-%, or at least 0.04 at-%, or at least 0.05 at-% and/or at most 0.15 at-%, or at most 0.3 at-%, or at most 0.5 at-%, or at most 1 at-%, or at most 2 at-%.

3. The display element according to claim 1, wherein the first phosphor layer has an average atomic percentage of activators, at-$\%_X^{ave}$, of at least 0.05 at-% or at least 0.1 at-% and/or at most 1.5 at-% or at most 3 at-%.

4. The display element according to claim 1, wherein the first phosphor layer has an atomic ratio of group 4 elements to activators, $R_{Y:X}^{ave}$, of at most 1, or at most 0.8, or at most 0.6, or at most 0.4.

5. The display element according to claim 1, wherein the first insulator layer and/or the second insulator layer comprises a compound of a group 4 element, Y, used as a dopant in the first phosphor layer.

6. The display element according to claim 1, comprising a third insulator layer and a second phosphor layer between the second insulator layer and the third insulator layer.

7. The display element according to claim 1, wherein the display element is implemented as an inorganic thin film electroluminescent, TFEL, display element.

8. A method comprising:
using a display element for displaying,
wherein the display element comprises at least a first phosphor layer of an activator-group 4 element codoped zinc sulfide, ZnS:X,Y;
wherein at least one of europium, Eu; manganese, Mn; samarium, Sm; and terbium, Tb, is used as an activator, X, in the first phosphor layer; and
wherein at least one of titanium, Ti; zirconium, Zr; hafnium, Hf; and rutherfordium, Rf, is used as a group 4 element dopant, Y, in the first phosphor layer.

9. The method according to claim 8, wherein using the display element comprises increasing at least one of aging stability and brightness of the display element based on using the group 4 element.

10. The method according to claim 8, wherein the display element comprises a first insulator layer and a second insulator layer such that the phosphor layer between the first insulator layer and the second insulator layer.

11. A method for manufacturing a display element, the method comprising:
forming a first insulator layer;
forming a first phosphor layer of activator-group 4 element codoped zinc sulfide, ZnS:X, Y; and forming a second insulator layer such that the first phosphor layer is arranged between the first insulator layer and the second insulator layer;

wherein the first phosphor layer has an average atomic percentage of group 4 elements, at-%$_{ave}^{Y}$, of at least 0.01 atomic percent, at-%;

wherein at least one of europium, Eu; manganese, Mn; samarium, Sm; and terbium, Tb, is used as an activator, X, in the first phosphor layer; and wherein at least one of titanium, Ti; zirconium, Zr; hafnium, Hf; and rutherfordium, Rf, is used as a group 4 element dopant, Y, in the first phosphor layer.

12. The method according to claim 11, further comprising:

forming a second phosphor layer such that the second insulator layer is arranged between the first phosphor layer and the second phosphor layer; and forming a third insulator layer such that the second phosphor layer is arranged between the second insulator layer and the third insulator layer.

13. The method according to claim 11, wherein forming the first phosphor layer comprises performing an atomic layer deposition.

14. The method according to claim 13, wherein at least one of forming the first insulator layer and forming the second insulator layer comprises performing an atomic layer deposition, wherein a group 4 element, Y, precursor is used in the atomic layer deposition for forming the first phosphor layer as a precursor.

15. The method according to claim 11, wherein the first phosphor layer has an average atomic percentage of group 4 elements, at-%$_{Y}^{ave}$, of at least 0.01 at-%, or at least 0.02 at-%, or at least 0.03 at-%, or at least 0.04 at-%, or at least 0.05 at-% and/or at most 0.15 at-%, or at most 0.3 at-%, or at most 0.5 at-%, or at most 1 at-%, or at most 2 at-%.

16. The method according to claim 11, wherein the first phosphor layer has an average atomic percentage of activators, at-%$_{X}^{ave}$, of at least one of at least 0.05 at-% or at least 0.1 at-% and at most 1.5 at-% or at most 3 at-%.

* * * * *